(12) United States Patent
Nagamine et al.

(10) Patent No.: US 9,758,857 B2
(45) Date of Patent: Sep. 12, 2017

(54) DEPOSITION DEVICE AND DEPOSITION METHOD

(71) Applicant: KOBE STEEL, LTD., Kobe-shi (JP)

(72) Inventors: Asuka Nagamine, Takasago (JP); Hiroshi Tamagaki, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 14/782,711

(22) PCT Filed: Mar. 31, 2014

(86) PCT No.: PCT/JP2014/001875
§ 371 (c)(1),
(2) Date: Oct. 6, 2015

(87) PCT Pub. No.: WO2014/184997
PCT Pub. Date: Nov. 20, 2014

(65) Prior Publication Data
US 2016/0047032 A1 Feb. 18, 2016

(30) Foreign Application Priority Data

May 15, 2013 (JP) ................. 2013-103269

(51) Int. Cl.
*C23C 14/00* (2006.01)
*C23C 14/24* (2006.01)
(Continued)

(52) U.S. Cl.
CPC .......... *C23C 14/24* (2013.01); *C23C 14/3407* (2013.01); *C23C 14/35* (2013.01);
(Continued)

(58) Field of Classification Search
CPC ................................................ H01J 37/3411
See application file for complete search history.

(56) References Cited

U.S. PATENT DOCUMENTS 6,083,359 A    7/2000  Vanden Brande et al.
6,207,026 B1 *  3/2001  Crocker .................. C23C 14/35
                                                      118/724
(Continued)

FOREIGN PATENT DOCUMENTS

JP   5-311430 A    11/1993
JP   6-93442 A     4/1994
(Continued)

OTHER PUBLICATIONS

International Search Report and Written Opinion issued Jun. 24, 2014 in PCT/JP2014/001875 filed Mar. 31, 2014.

*Primary Examiner* — Timon Wanga
(74) *Attorney, Agent, or Firm* — Oblon, McClelland, Maier & Neustadt, L.L.P.

(57) ABSTRACT

The present invention is to provide a deposition device capable of coping with a size change of a substrate only by replacing a magnet unit and a target material. A deposition device (1) of the present invention is to perform deposition onto a surface of a substrate W to be conveyed by using an evaporation source (2) facing a front surface of the substrate (W), and the evaporation source (2) has a target material (7), a backing plate (8), a magnet unit (9), a cathode body (10), and a cooling water flow passage (12). The cooling water flow passage (12) is a space formed by separating the magnet unit (9) and the backing plate (8), and the cooling water can be distributed through this space. As the magnet unit (9), a short magnet unit can be arranged in correspondence with a narrow-width substrate having narrower width than that of the substrate (W), and as the target material (7), a short target material is arranged in correspondence with width of the arrange magnet unit (9).

6 Claims, 7 Drawing Sheets

(51) Int. Cl.
*C23C 14/35* (2006.01)
*C23C 14/34* (2006.01)
*C23C 14/56* (2006.01)
*H01J 37/34* (2006.01)

(52) U.S. Cl.
CPC ........ *C23C 14/562* (2013.01); *H01J 37/3408* (2013.01); *H01J 37/3452* (2013.01)

(56) References Cited

U.S. PATENT DOCUMENTS

| | | | |
|---|---|---|---|
| 2002/0144726 A1* | 10/2002 | Yamashita | H01L 31/022425 136/252 |
| 2003/0094362 A1 | 5/2003 | Gstoehl et al. | |
| 2009/0277780 A1* | 11/2009 | Jaderberg | C23C 14/35 204/192.13 |
| 2010/0314075 A1* | 12/2010 | Takahashi | B23K 20/122 165/104.19 |
| 2013/0284594 A1* | 10/2013 | Bluck | H01J 37/32779 204/298.07 |

FOREIGN PATENT DOCUMENTS

| | | |
|---|---|---|
| JP | 9-125245 A | 5/1997 |
| JP | 2001-509209 A | 7/2001 |
| JP | 3411312 B2 | 5/2003 |
| JP | 2003-193227 A | 7/2003 |
| JP | 2009-149973 A | 7/2009 |
| JP | 2010-132994 A | 6/2010 |
| JP | 2011-117019 A | 6/2011 |
| JP | 2013-14803 A | 1/2013 |

\* cited by examiner

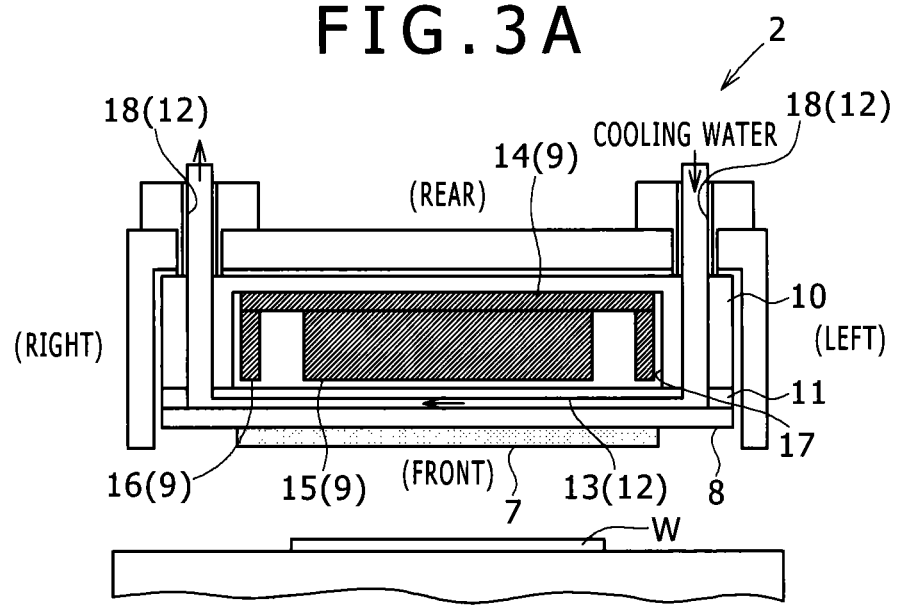
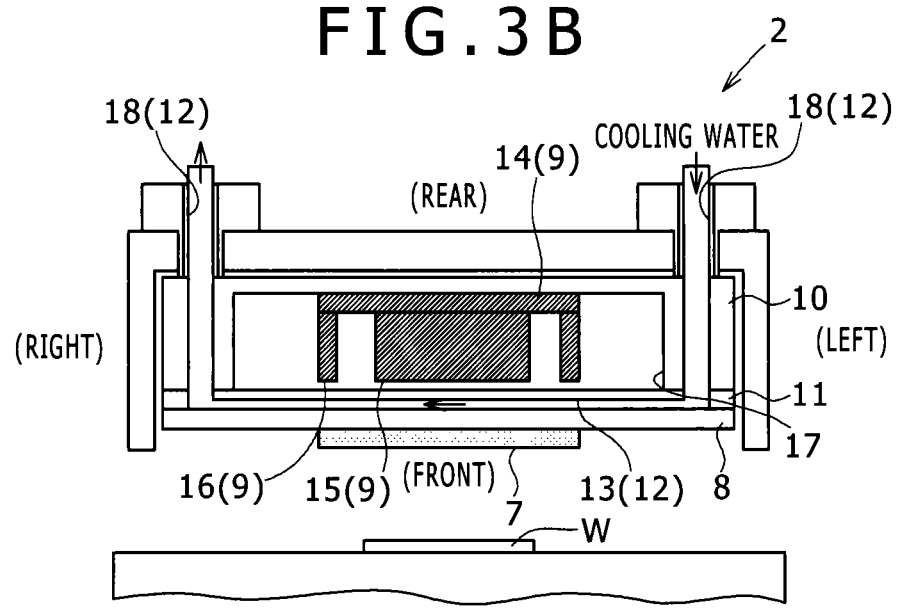

DEPOSITION DEVICE AND DEPOSITION METHOD

TECHNICAL FIELD

The present invention relates to a deposition device and a deposition method capable of performing stable deposition onto substrates having different size.

BACKGROUND ART

In general, a deposition device such as a magnetron sputtering device is formed to generate plasma on a surface of a substrate such as a synthetic resin film and perform deposition by utilizing the generated plasma. An evaporation source for sputtering used in such a deposition device has a magnet unit forming a magnetic field for generation of plasma, and a target material formed of a deposition material. In a case of a racetrack type, the magnet unit is formed by a long rod shape center magnet provided on a surface of a yoke, and an outer peripheral magnet provided on the surface of the yoke so as to surround this center magnet, and is capable of forming uniform plasma along the longitudinal direction.

At the time of performing deposition on the surface of the substrate by using the above evaporation source, the target material is installed on the surface side of a backing plate, and the magnet unit is installed on the back side of the backing plate. When voltage is added to the evaporation source by using a power supply or the like, plasma is generated along the magnetic field formed in the vicinity of a surface of the target material by the magnet unit, and deposition can be performed onto the surface of the substrate by utilizing the generated plasma.

When the above deposition is performed, the target material is exposed to the generated plasma so as to have a high temperature. Therefore, the evaporation source is frequently provided with a cooling means that cools the target material. For example, Patent Document 1 discloses a deposition device having the above racetrack type magnet unit, in which by distributing cooling water to pass through an interior of the magnet unit, a target material is cooled via a backing plate. In this deposition device of Patent Document 1, a pipe through which the cooling water is distributed is formed in a cathode body. By introducing the cooling water into a cooling water flow passage passing through the interior of the magnet unit from this pipe of the cathode body, the target material can be cooled via the backing plate.

In the above deposition device, width of the substrate onto which deposition is performed is hardly varied, and the deposition device has a specification to perform deposition onto a substrate having preliminarily determined width in general. However, at the time of actually performing deposition in mass production, there can be a situation where deposition has to be performed onto a substrate to be subjected to deposition, the substrate having narrower width than normal in reality.

For example, in a device called as a sputtering roll coater in which a film substrate wound into a roll form is fed out and continuously moved through a front of an evaporation source while performing deposition, and then taken up into a roll form again, deposition is generally performed onto a film substrate having nearly maximum width for the device. However, according to circumstances, there is sometimes a case where deposition needs to be performed onto a film substrate having width much narrower than (for example, a half or less of) the maximum width for the device. In such a case, by using a sputter source of size suitable for a deposition treatment of the film substrate having maximum width, deposition is performed while attaching an evaporation mask matched with the film width and blocking unnecessary vapor.

In such a way, deposition can be performed onto a film having narrow width. However, in order to perform deposition onto a substrate having narrow width, a target material having maximum width is evaporated. Thus, an expensive deposition substance is wasted, so that manufacturing cost is remarkably increased.

As a method of solving such a problem, there is a method of, in a case where deposition is performed onto a film substrate having narrow width, replacing with a corresponding evaporation source having narrow width. In such a way, deposition can be performed with a small target material. Thus, no deposition substance is wasted. However, in order to realize this, one set of evaporation source needs to be replaced. Thus, a replacement task becomes enormous. There is also a problem that plural evaporation sources having different size have to be prepared in advance and cost of the device is increased.

CITATION LIST

Patent Document

Patent Document 1: JP 5-311430 A

SUMMARY OF THE INVENTION

An object of the present invention is to provide a deposition device and a deposition method capable of performing deposition onto substrates having different width just by replacing only a magnet unit and a target material forming an evaporation source without replacing the entire evaporation source.

A deposition device to be provided in the present invention is a deposition device that performs deposition onto a surface of a substrate to be conveyed by using an evaporation source facing the substrate, wherein the evaporation source has a flat plate shape target material formed of a deposition substance, a backing plate in which the target material is attached to a surface, a magnet unit arranged on the back side of the backing plate, the magnet unit forming a magnetic field for a magnetron discharge in the vicinity of a surface of the target material, a cathode body accommodating the magnet unit, and a cooling water flow passage which is a space formed by separating the magnet unit and the backing plate, the space through which cooling water is capable of being distributed, and as the magnet unit, in a case where a treatment is done onto a narrow-width substrate having narrower width than that of the substrate, a short magnet unit can be arranged in correspondence with this, and as the target material, a short target material is arranged in correspondence with width of the arranged magnet unit.

Meanwhile, in a deposition method of the present invention, at the time of performing deposition onto a surface of a substrate by using the above deposition device, in a case where deposition is performed onto a surface of a narrow-width substrate having narrower width than that of the substrate, a short magnetic unit is arranged, a short target material is arranged in correspondence with width of the arranged magnetic unit, and then deposition is implemented.

BRIEF DESCRIPTION OF DRAWINGS

FIG. 3A is a sectional plan view showing deposition performed onto the substrate having normal width by using the evaporation source of the first embodiment of the present invention.

FIG. 3B is a sectional plan view showing deposition performed onto the substrate having narrow width by using the evaporation source of the first embodiment of the present invention.

DESCRIPTION OF EMBODIMENTS

Hereinafter, a deposition device 1 according to embodiments of the present invention will be described in detail based on the drawings.

Figure 1A:
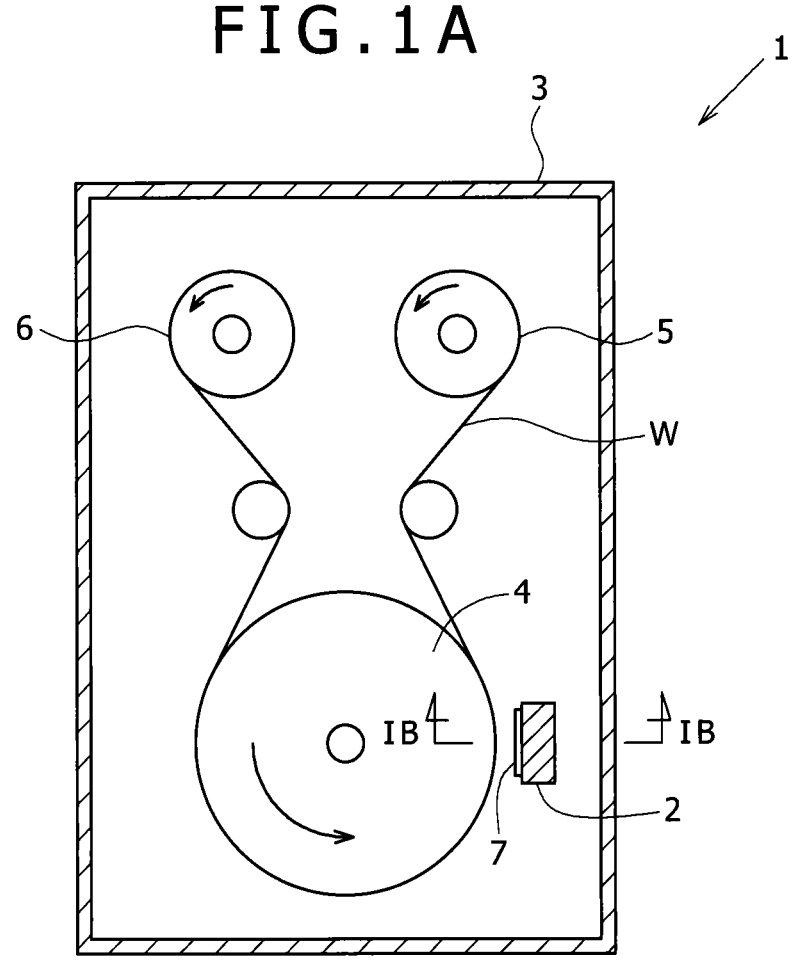
FIG. 1A is a sectional front view showing a configuration of a deposition device according to embodiments of the present invention.
Figure 1B:
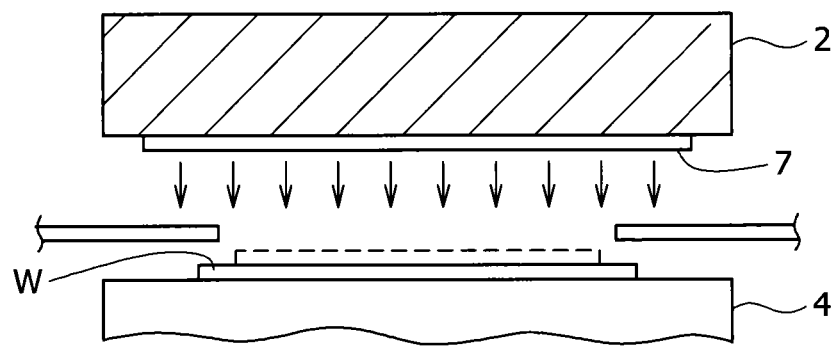
FIG. 1B is a view in which a sectional view taken along the line IB-IB of FIG. 1B is rotated anti-clockwise by 90°.

FIG. 1A shows the entire configuration of a deposition device 1 of a first embodiment of the present invention, and FIG. 1B shows a sectional view of an evaporation source 2.

As shown in FIG. 1A, the deposition device 1 has a box shape vacuum chamber 3 whose interior can be evacuated. A vacuum pump (not shown) is connected to this vacuum chamber 3 via an exhaust tube or the like. By exhausting by using the vacuum pump, the interior of the vacuum chamber 3 is brought into a vacuum or extremely-low pressure state. In the vacuum chamber 3, a deposition drum 4 in which a substrate W such as a film to be subjected to deposition is wound onto an outer peripheral surface and guided is arranged. In the vacuum chamber 3, a feed roll 5 that feeds the substrate W toward this deposition drum 4, and a take-up roll 6 that takes up the substrate W onto which deposition is performed on this deposition drum 4 are provided.

Further, in the interior of the vacuum chamber 3, the evaporation source 2 is arranged so as to face the substrate W wound onto the deposition drum 4. Electric power (DC (direct current), pulse DC (intermittent direct current), MF-AC (alternate current in a middle frequency band), FR (high frequency), or the like) for generating plasma is supplied from a plasma power supply to this evaporation source 2. When a discharge gas of argon or the like is introduced in the vacuum chamber 3 in a decompressed state and the evaporation source 2 is electrically charged, plasma is generated on a front surface of the evaporation source 2, so that deposition can be performed onto the substrate W.

It should be noted that in the following description, the up and down direction of a paper plane of FIG. 2A will be called as the front and rear direction at the time of describing the deposition device 1. The left and right direction of the paper plane of FIG. 2A will be called as the left and right direction at the time of describing the deposition device 1. Meanwhile, the up and down direction of a paper plane of FIG. 2B will be called as the up and down direction at the time of describing the deposition device 1.

In the following embodiments, the deposition device 1 of the present invention will be described with an example of a device of performing deposition by using a magnetron sputtering method.

Further, in the following description, the embodiments in which deposition is performed onto two kinds of substrates W having narrow width and normal width will be described. In this case, the substrate W having normal width is called as the "normal substrate", and the substrate W having narrower width than the normal substrate is called as the "narrow-width substrate", so that both the substrates are distinguished from each other and expressed.

Figure 2A:
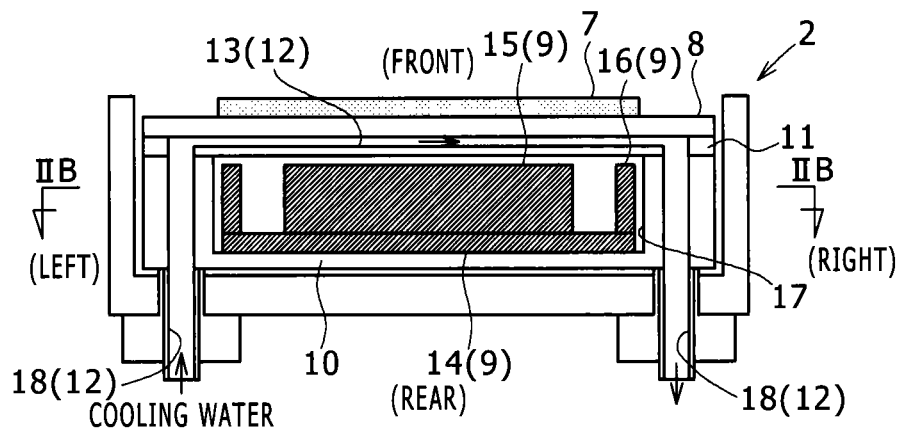
FIG. 2A is a sectional plan view showing a configuration of an evaporation source of a first embodiment in a case where deposition is performed onto a substrate having normal width.

FIG. 2A shows a configuration of the evaporation source 2 of the first embodiment in a case where deposition is performed onto the substrate W (normal substrate).

As shown in FIG. 2A, the evaporation source 2 of the first embodiment includes a flat plate shape target material 7 formed of a deposition substance, a backing plate 8 in which this target material 7 is attached to a surface, and a magnet unit 9 arranged on the back side of the backing plate 8, the magnet unit forming a magnetic field for a magnetron discharge in the target material 7.

This evaporation source 2 also has a cathode body 10 accommodating the magnet unit 9, and a water passage plate 11 is arranged between this cathode body 10 and the backing plate 8. This water passage plate 11 is arranged between the backing plate 8 and the magnet unit 9 so as to isolate (separate) both the members. A flow passage groove 13 forming a cooling water flow passage 12 to be described later is formed on a surface of this water passage plate 11.

Next, the target material 7, the backing plate 8, the magnet unit 9, the cathode body 10, the water passage plate 11, and the cooling water flow passage 12 forming the evaporation source 2 of the first embodiment will be described.

Firstly, the target material 7 is formed by processing a material serving as a raw material of a coating to be deposited onto the substrate W into a plate shape. Materials capable of being formed into a plate shape such as a metal material, an inorganic material of C, Si, or the like, a transparent conductive film material of ITO or the like, a compound of $SiO_2$, SiN or the like, and an organic material can be used as the target material 7. For example, in a case where a hard coating of TiN, TiAlN, CrN, or the like is deposited on a surface of the substrate W, a metal plate of Ti, a TiAl alloy, Cr, or the like is used.

Width of the target material 7 is formed to be width slightly wider than that of the normal substrate in correspondence with width of the above normal substrate. The electric power for generating plasma is supplied from the above plasma power supply to this target material 7 through the cathode body 10, and the voltage with which plasma can be formed is added to a surface.

The backing plate 8 is generally formed of metal in a plate shape. Although copper excellent in both thermal conductivity and electric conductivity is frequently used, SUS or the like can also be used. The surface of the backing plate 8 is smoothened, so that by attaching or removing the above target material 7, the backing plate 8 itself can be re-used.

The magnet unit 9 is formed by a yoke 14 arranged in parallel with the backing plate 8, a center magnet 15 arranged in center of this yoke 14, and an outer peripheral magnet 16 arranged on a surface of the yoke 14 on the outer side of this center magnet 15.

Figure 2B:
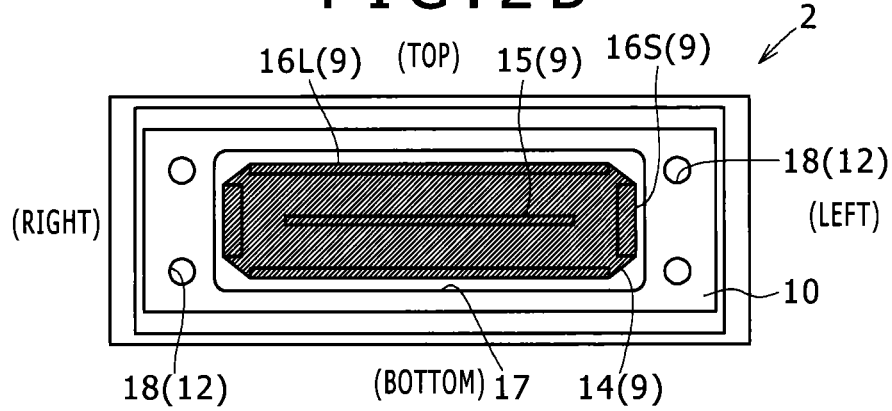
FIG. 2B is a sectional view taken along the line IIB-IIB of FIG. 2A.
Figure 2C:
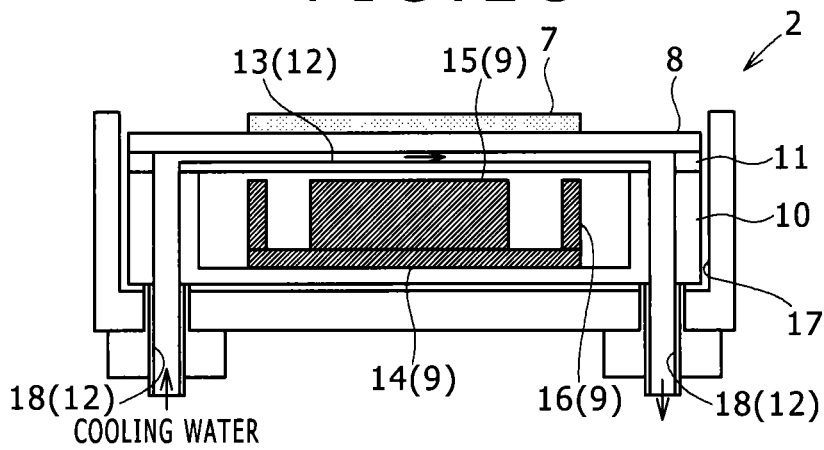
FIG. 2C is a sectional plan view showing the evaporation source of the first embodiment in a case where deposition is performed onto a substrate having narrow width.

Specifically, as shown in FIGS. 2A and 2B, the yoke 14 is a magnetic body of soft iron or the like formed in a plate shape. At an outer edge of the yoke 14, the plate shape outer peripheral magnet 16 standing in the direction perpendicular to the surface of the yoke 14 (front and rear direction) is provided.

The outer peripheral magnet 16 is formed by combining plural plate magnets. Specifically, this outer peripheral magnet 16 has one pair of long plate magnets 16L extending along the long side direction of the backing plate 8 (left and right direction), the plate magnets being arranged in parallel with each other, and one pair of short plate magnets 16S extending along the short side direction of the backing plate 8 (up and down direction), the plate magnets being arranged in parallel with each other. All these four plate magnets are arranged in such a manner that ends facing the side of the target material 7 (front side) have the same magnetic pole.

The center magnet 15 is a plate magnet standing toward the direction perpendicular to the surface of the yoke 14 (front side) as well as the outer peripheral magnet 16. The center magnet 15 is placed in center of the above four plate magnets forming the outer peripheral magnet 16, and attached in such a manner that a magnetic pole different from that of the outer peripheral magnet 16 is placed in an end facing the side of the target material 7.

That is, in the above magnet unit 9, a magnetic line extending from the center magnet 15 placed in the center of the yoke 14 toward the side of the target material 7 and coming out to the outside of the magnet unit 9 passes through the vicinity of the surface of the target material 7, and returns to the outer peripheral magnet 16 of the yoke 14 placed inside the magnetic unit 9 again. At this time, a magnetic field is formed in the vicinity of the surface of the target material 7.

It should be noted that although the magnet unit 9 is formed in an oblong shape in this description, an outer shape of the magnet unit may be a racetrack shape by forming the short plate magnets 16S arranged in the ends of the outer peripheral magnet into an arc shape.

The cathode body 10 is a square container capable of accommodating the above magnet unit 9. A recessed portion 17 opening toward the side of the target material 7 is formed on a surface of the cathode body 10. This recessed portion 17 has inner dimensions slightly larger than those of the magnet unit 9 in the up and down direction and the left and right direction. In an interior of the recessed portion, the magnet unit 9 can be accommodated. Depth of the recessed portion 17, in other words, an inner dimension of the recessed portion 17 in the front and rear direction is substantially equal to thickness of the magnet unit 9 in general. However, the depth may be such a dimension that the magnet unit 9 can be accommodated in combination with other members.

In the cathode body 10 on the outer side of the recessed portion 17 in the left and right direction, cooling water supply/discharge pipes 18 through which cooling water is supplied are formed. The cooling water supply/discharge pipes 18 pass through the cathode body 10 in the thickness direction (front and rear direction), and provided in at least two points (four points in the figures) around the recessed portion 17. Among these cooling water supply/discharge pipes 18 in four points, the cooling water supply/discharge pipes 18 placed on the left side of the magnet unit 9 are used as introduction tubes through which the cooling water before cooling is supplied, and the cooling water supply/discharge pipes 18 placed on the right side of the magnet unit 9 are used as ejection tubes through which the cooling water after cooling is discharged.

In the example shown in the figures, the cooling water supply/discharge pipes 18 are placed in four points, so that the backing plate is cooled in two independent systems. Alternatively, the cooling water supply/discharge pipes 18 may be provided in two points and accordingly a flow of the cooling water may be controlled in a water passage.

The deposition device 1 of the first embodiment has the water passage plate 11 arranged between the cathode body 10 and the backing plate 8 so as to isolate (separate) both the members. The flow passage groove 13 is formed on the surface of this water passage plate 11. By laying the water passage plate 11 and the backing plate 8 on each other, the cooling water flow passage 12 in which the cooling water can be distributed through a space formed by separating the magnet unit 9 and the backing plate 8 can be formed.

Next, the cooling water flow passage 12 and the water passage plate 11 serving as characteristics of the deposition device 1 of the present invention will be described.

The water passage plate 11 is arranged on the front side of the cathode body 10 so as to close an opening of the recessed portion 17 of the cathode body 10, serving as a member that functions as a lid for the recessed portion 17. Size of the water passage plate 11 is substantially the same as an outer dimension of the cathode body 10, so that the water passage plate can cover the entire front surface of the cathode body 10. In an interior of the water passage plate 11, the cooling water flow passage 12 through which the cooling water is distributed is formed.

The cooling water flow passage 12 is formed to cool the cooling water supplied through the left cooling water supply/discharge pipes 18 of the cathode body 10 while letting the cooling water pass through the interior of the water passage plate 11, and to discharge the cooling water after cooling from the right cooling water supply/discharge pipes 18 of the cathode body 10. Specifically, this cooling water flow passage 12 extends from a connection point to the left cooling water supply/discharge pipes 18 toward the front side so as to pass through the interior of the water passage plate 11 in the front and rear direction. Next, the cooling water flow passage 12 extending to a front surface of the water passage plate 11 turns in the other direction on the front surface of the water passage plate 11 and extends along the left and right direction in a gap between the backing plate 8 and the water passage plate 11. Finally, the cooling water flow passage 12 extends toward the rear side so as to pass through the interior of the water passage plate 11 in the front and rear direction, and discharges the cooling water from the right cooling water supply/discharge pipes 18 to the outside of the water passage plate 11.

A part of the above cooling water flow passage 12, the part being placed along the front surface of the water passage plate 11 serves as the flow passage groove 13 through which the cooling water is distributed along the left and right direction. This flow passage groove 13 is opened toward the front side, so that the cooling water is brought into direct contact with the surface of the backing plate 8 laid on the water passage plate 11 to efficiently cool the backing plate 8. A range where the flow passage groove 13 is formed on the surface of the water passage plate 11 can cover the entire region of a front surface of the magnet unit 9, so that the target material 7 receiving incoming heat from plasma at a position corresponding to the magnet unit 9 can be cooled via the backing plate 8.

As described above, by arranging the water passage plate 11 between the magnet unit 9 and the backing plate 8 and providing the cooling water flow passage 12 in this water passage plate 11, the backing plate 8 and the water passage plate 11 can be removed from the cathode body 10 in a state where the backing plate and the water passage plate are fastened in advance.

Figure 6A:
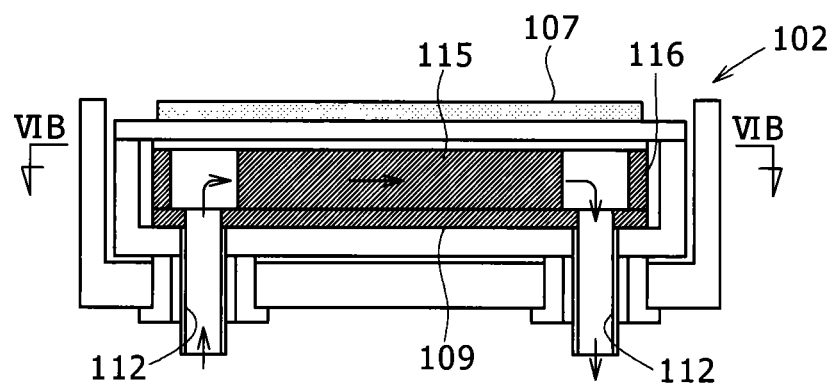
FIG. 6A is a sectional plan view showing a configuration of a conventional evaporation source in a case where deposition is performed onto the substrate having normal width.
Figure 6B:
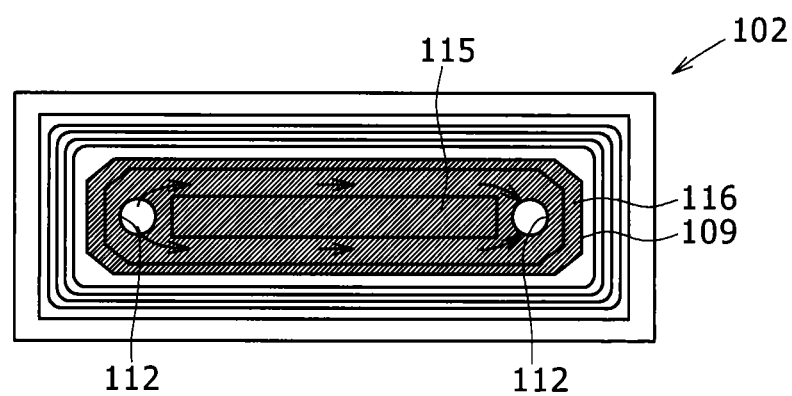
FIG. 6B is a sectional view taken along the line VIB-VIB of FIG. 6A.

Meanwhile, for example, a conventional evaporation source 102 shown in FIGS. 6A and 6B has such a structure that cooling water pipes 112 are formed so as to pass through an interior of a magnet unit 109 in the front and rear direction and cooling water supplied through the left cooling water pipe 112 is guided to a water passage formed between a center magnet 115 and an outer peripheral magnet 116 and directed in the left and right direction, so as to cool a target 107 via a backing plate 108. The cooling water used for cooling is discharged through the right cooling water pipe 112.

Figure 6C:
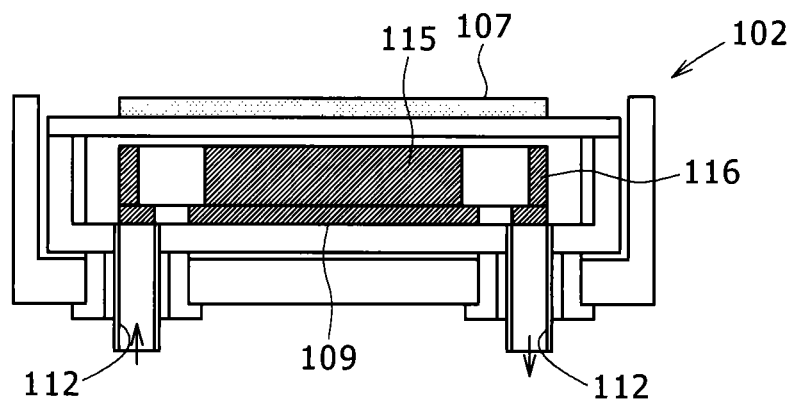
FIG. 6C is a sectional plan view showing a configuration of the conventional evaporation source in a case where deposition is performed onto the substrate having narrow width.

When size of the magnet unit 109 is changed in this evaporation source, as shown in FIG. 6C, positions of the cooling water pipes 112 in a cathode body are not matched with positions of the cooling water pipes 112 in the magnet unit 109, and hence the cooling water cannot be supplied. Therefore, the size of the magnet unit cannot be changed in the conventional evaporation source.

However, in the evaporation source 2 of the first embodiment, the cooling water flow passage 12 is formed in the cathode body 10 and the water passage plate 11 fixed irrespective of the width of the substrate W. Thus, even when width of the target material 7 and the magnet unit 9 is changed in correspondence with width of the narrow-width substrate, a position of the cooling water flow passage 12 is not changed, and cooling does not become insufficient.

For example, as shown in FIG. 3A, in a case of the normal substrate, when a target material 7 and a magnet unit 9 having slightly greater width than substrate width of the normal substrate are prepared, the cooling water can be distributed through the cooling water pipe 12 and the target material 7 can be cooled via the backing plate 8. Thus, stable deposition can be performed onto the normal substrate.

Meanwhile, as shown in FIG. 3B, in a case where deposition is performed onto the narrow-width substrate having narrower width than that of the normal substrate, a short target material 7 and a short magnet unit 9 are prepared in correspondence with substrate width of the narrow-width substrate. Even so, the cooling water can also be distributed to a back surface of the backing plate 8 through the cooling water pipe 12. In such a way, deposition can also be performed onto the narrow-width substrate having different width from that of the normal substrate with less waste of the target material.

That is, when both the short target material 7 and the short magnet unit 9 are prepared in advance in correspondence with the narrow-width substrate, deposition can be performed in correspondence with a size change of the substrate W without waste just by replacing only the magnet unit 9 and the target material 7 forming the evaporation source 2 without replacing all one set of the evaporation source 2.

Further, when the water passage plate 11 is arranged between the above backing plate 8 and the cathode body 10, the water passage plate 11 can be easily attached to and detached from the cathode body 10 together with the backing plate 8. Thus, a watertight seal structure can be achieved with the small number of bolts.

Furthermore, in the deposition device 1 of the first embodiment, the cooling water flow passage 12 passes through the interior of the cathode body 10 and the water passage plate 11. Thus, the cooling water is not brought into contact with the magnet unit 9. Therefore, durability of the magnet unit 9 vulnerable to water can be enhanced, so that stable deposition can be performed for a long time.

Next, with using FIGS. 4A to 4C, a deposition device 1 of a second embodiment will be described.

Figure 4A:
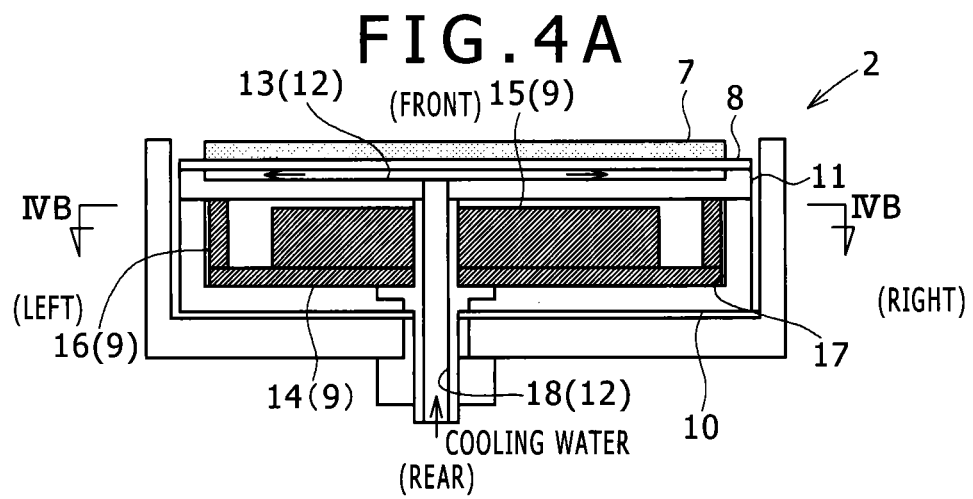
FIG. 4A is a sectional plan view showing a configuration of an evaporation source of a second embodiment in a case where deposition is performed onto the substrate having normal width.
Figure 4B:
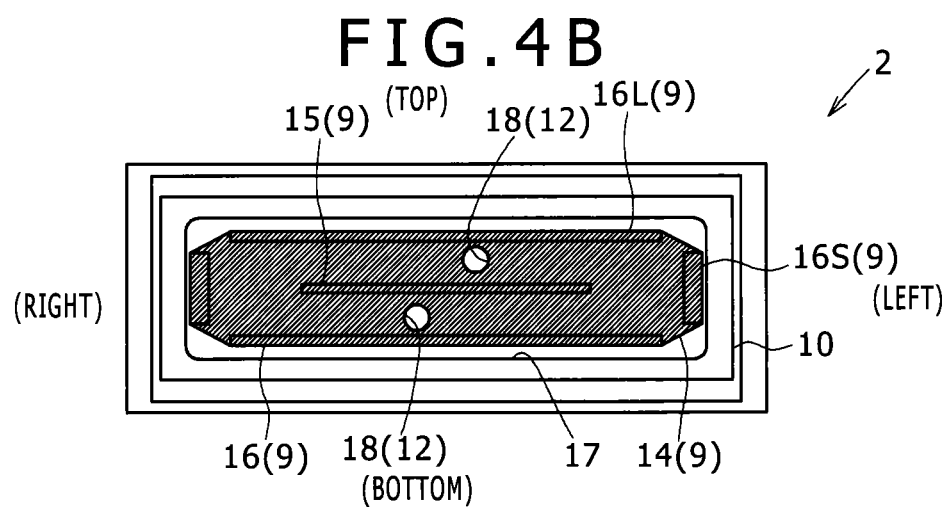
FIG. 4B is a sectional view taken along the line IVB-IVB of FIG. 4A.
Figure 4C:
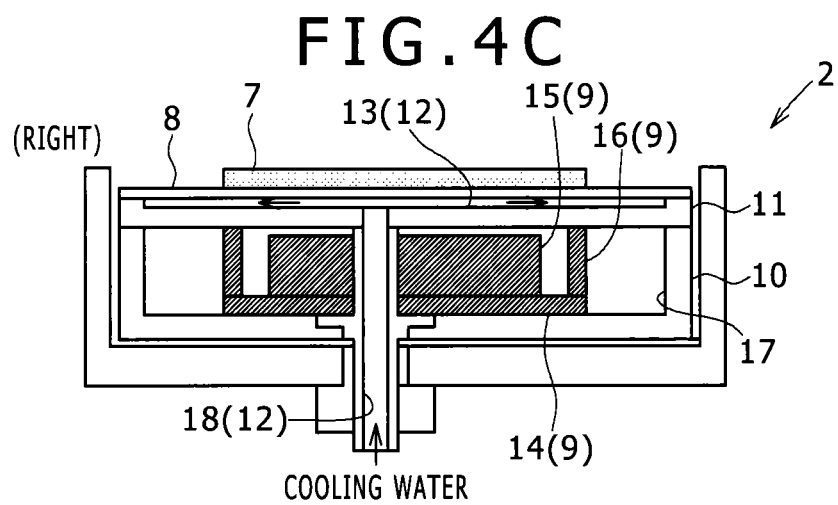
FIG. 4C is a sectional plan view showing the evaporation source of the second embodiment in a case where deposition is performed onto the substrate having narrow width.

As shown in FIGS. 4A to 4C, the deposition device 1 of the second embodiment is characterized in that cooling water supply/discharge pipes 18 of a cooling water flow passage 12 through which cooling water is supplied to a back surface of a backing pate 8 are not provided on both the sides of a magnet unit 9 in a cathode body 10 but provided so as to pass through center of the magnet unit 9.

That is, in the deposition device 1 of the second embodiment, two cooling water supply/discharge pipes 18 through which the cooling water is supplied or discharged are formed up and down in substantial center of the cathode body 10 in the left and right direction. One cooling water supply/discharge pipe 18 of these two cooling water supply/discharge pipes 18 (lower cooling water supply/discharge pipe 18 of the cathode body 10) serves as an introduction passage of the cooling water, and the other cooling water supply/discharge pipe 18 (upper cooling water supply/discharge pipe 18 of the cathode body 10) serves as an ejection passage of the cooling water. Both these cooling water supply/discharge pipes 18 are formed so as to pass through the magnet unit 9 and a water passage plate 11 in the front and rear direction, so that the cooling water can be distributed through a flow passage groove 13 formed on a front surface of the water passage plate 11.

The flow passage groove 13 formed in the water passage plate 11 of the second embodiment is formed so as to surround a center magnet 15 unlike the first embodiment, so that the cooling water supplied from one of the cooling water supply/discharge pipes 18 can be distributed from the lower side toward the upper side to circulate around the center magnet 15 and the cooling water can be concentrically discharged from the other cooling water flow passage 12.

In the above deposition device 1 of the second embodiment, the cooling water supply/discharge pipes 18 are not formed in a wall of the cathode body 10 but arranged in the center of the cathode body 10. Accordingly, width of the cathode body 10 is more compact than that of the first embodiment.

In an evaporation source 2 of the second embodiment, the cooling water flow passage 12 is concentrically provided in the center of the magnet unit 9. Thus, within a range where the central cooling water flow passage 12 is unchanged, the magnet unit 9 can be downsized in the left and right direction, and size and arrangement of the magnet unit 9 can be freely changed. By forming the target material 7 into a shape corresponding to this magnet unit 9, a device configuration optimal for both the substrate having normal width and the substrate having narrow width can be realized.

Next, with using FIGS. 5A to 5D, a deposition device 1 of a third embodiment will be described.

Figure 5A:
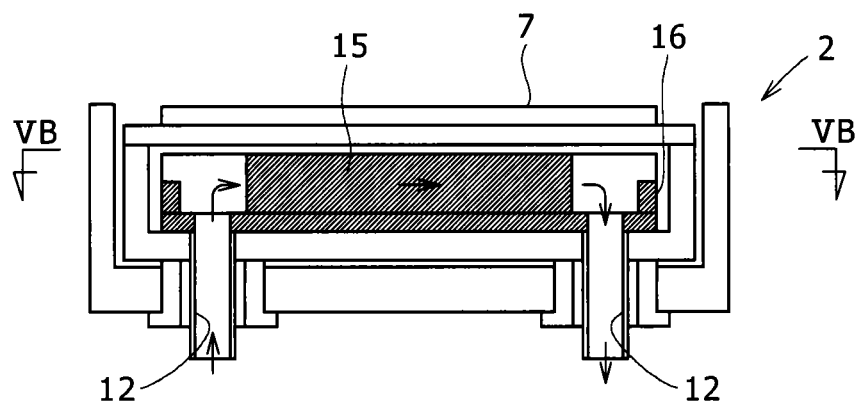
FIG. 5A is a sectional plan view showing a configuration of an evaporation source of a third embodiment in a case where deposition is performed onto the substrate having normal width.
Figure 5B:
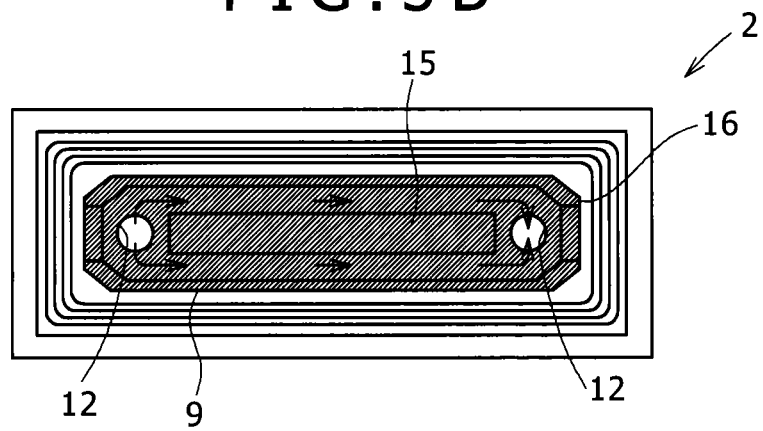
FIG. 5B is a sectional view taken along the line VB-VB of FIG. 5A.

As shown in FIGS. 5A and 5B, in the deposition device 1 of the third embodiment, as well as the cooling water pipes 112 of the conventional evaporation source 102 shown in FIGS. 6A and 6B, a pair of cooling water pipes 12 is formed so as to pass through an interior of a magnet unit 9 in the front and rear direction. The deposition device 1 has such a structure that cooling water supplied through the left cooling water pipe 12 is guided to a water passage formed between a center magnet 15 and an outer peripheral magnet 16 and directed in the left and right direction and a target 7 is cooled via a backing plate 8. The cooling water used for cooling is discharged through the right cooling water pipe 12.

Figure 5C:
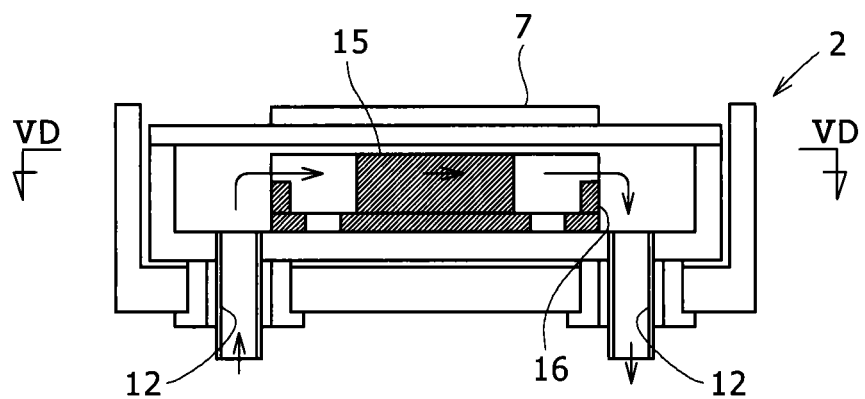
FIG. 5C is a sectional plan view showing a configuration of the evaporation source of the third embodiment in a case where deposition is performed onto the substrate having narrow width.
Figure 5D:
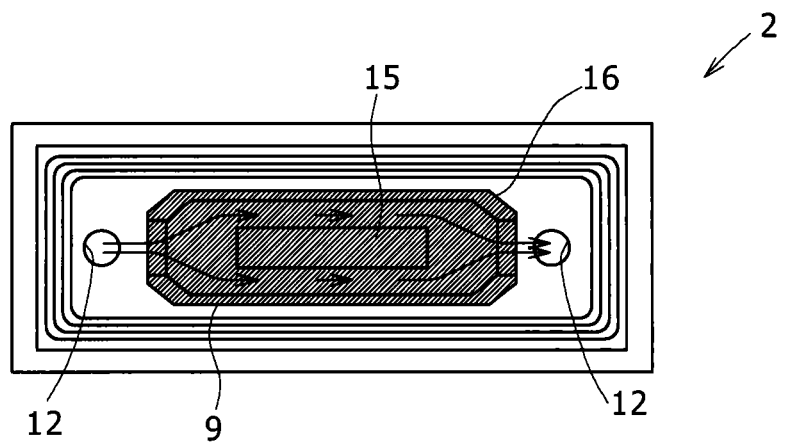
FIG. 5D is a sectional view taken along the line VD-VD of FIG. 5C.

A difference between this evaporation source 2 according to the third embodiment and the conventional evaporation source 102 is a point that height of a short side of the outer peripheral magnet 16 of the magnet unit 9 is designed to be lower than that of a long side. Therefore, as shown in FIG. 5C, in a case where a short magnet unit 9 is attached to a cathode body 10, a flow passage of cooling water can be ensured as shown in FIGS. 5C, 5D. Thus, by attaching a short target material 7 as shown in FIG. 5C, a deposition treatment can be economically performed onto a narrow-width substrate W as well as the first and second embodiments.

As described above, by using the deposition device 1 according to the embodiments of the present invention, deposition can be stably performed in correspondence with a size change of the substrate W just by replacing only the magnet unit 9 and the target material 7 forming the evaporation source 2 without replacing the entire evaporation source 2.

The present invention is not limited to the above embodiments but a shape, structure, material, combination, and the like of the members can be appropriately changed within a range not changing the gist of the present invention. Regarding matters not explicitly disclosed in the embodiments disclosed herein such as an operation condition, a production condition, various parameters, dimensions of constituent parts, weight, and volume, values not departing from a range that those skilled in the art generally implement, the values easily anticipated by those skilled in the art in general are adopted.

According to the present invention, the deposition device and the deposition method capable of performing deposition onto substrates having different width just by replacing only the magnet unit and the target material forming the evaporation source without replacing the entire evaporation source.

The deposition device to be provided in the present invention is a deposition device that performs deposition onto a surface of a substrate to be conveyed by using an evaporation source facing the substrate, wherein the evaporation source has a flat plate shape target material formed of a deposition substance, a backing plate in which the target material is attached to a surface, a magnet unit arranged on the back side of the backing plate, the magnet unit forming a magnetic field for a magnetron discharge in the target material, a cathode body accommodating the magnet unit, and a cooling water flow passage which is a space formed by separating the magnet unit and the backing plate, the space through which cooling water is capable of being distributed. In a case where a treatment is done onto a narrow-width substrate having narrower width than that of the substrate, a short magnet unit can be arranged in correspondence with this, and a short target material is arranged in correspondence with width of the arranged magnet unit.

Meanwhile, in the deposition method of the present invention, at the time of performing deposition onto a surface of a substrate by using the above deposition device, in a case where deposition is performed onto a surface of a narrow-width substrate having narrower width than that of the substrate, a short magnetic unit is arranged, a short target material is arranged in correspondence with width of the arranged magnetic unit, and then deposition is implemented.

According to the deposition device and the deposition method of the present invention, deposition can be performed onto substrates having different width just by replacing only the magnet unit and the target material forming the evaporation source without replacing the entire evaporation source.

Preferably, the magnet unit may be formed in an oblong shape in a front view, and the cooling water flow passage may have an introduction passage formed on the outer side of one longitudinal end of the magnet unit, the introduction passage through which the cooling water flows in between a cooling water flow passage and the backing plate, and an ejection passage formed on the outer side of the other longitudinal end of the magnet unit, the ejection passage through which the cooling water is ejected to an exterior.

Preferably, the magnet unit may be formed in an oblong shape in a front view, and the cooling water flow passage may have an introduction passage formed in the vicinity of a longitudinally center part of the magnet unit, the introduction passage through which the cooling water flows into a part between the water passage plate and the backing plate, and an ejection passage formed in the longitudinally center part of the magnet unit, the ejection passage through which the cooling water is ejected to an exterior.

Preferably, the magnet unit may be formed in an oblong shape in a front view, in which at least height of a short side part of an outer peripheral magnetic pole is formed to be low, and in the cooling water flow passage, in a case where a normal-length magnetic unit is mounted, the cooling water may be introduced into or ejected from a space between the outer peripheral magnetic pole and a center magnetic pole in the vicinity of the short side part of the outer peripheral magnetic pole, and in a case where a short magnetic unit is mounted, the cooling water may be introduced into or ejected from the outer side of the short side part of the magnetic unit.

The invention claimed is:

1. A deposition device that performs deposition onto a surface of a substrate to be conveyed, the deposition device comprising an evaporation source facing the substrate, wherein the evaporation source comprises:
 a flat plate shape target material formed of a deposition substance,
 a backing plate, wherein the target material is attached to a side of the backing plate,
 a magnet unit arranged on another side of the backing plate which is opposite to the side of the backing plate to which the target material is attached, the magnet unit forming a magnetic field for a magnetron discharge in the vicinity of a surface of the target material, wherein, as the magnet unit, a short magnet unit is capable of being arranged in correspondence with a narrow-width substrate having narrower width than that of the substrate, and as the target material, a short target material is arranged in correspondence with width of the arranged magnet unit, a cathode body having a recess accommodating the magnet unit, and a cooling water passage plate forming a passage through which cooling water is capable of being distributed, the cooling water passage plate being attached to the another side of the backing plate so as to separate the magnet unit and the backing plate from one another, wherein the cooling water passage plate is separable from the cathode body, and wherein the cooling water passage plate and the backing plate form a removable lid for the recess of the cathode body, so that the cooling water passage plate and backing plate can be removed as a unit to replace the magnet unit with one of a smaller size without having to replace the entire deposition device.

2. The deposition device according to claim 1, wherein the magnet unit is accommodated in a space of the cathode body, the space being oblong in a front view, further comprising a cooling water introduction passage formed in one longitudinal end of the cathode body and communicating with the cooling water passage in the cooling water passage plate, and a cooling water ejection passage formed in the other longitudinal end of the cathode body and communicating with the cooling water passage in the cooling water passage plate.

3. The deposition device according to claim 1, wherein the magnet unit is formed in an oblong shape in a front view, and further comprising a cooling water introduction passage formed in a longitudinally center part of the magnet unit and communicating with the cooling water passage in the cooling water passage plate, and a cooling water ejection passage formed in the longitudinally center part of the magnet unit and communicating with the cooling water passage in the cooling water passage plate.

4. A deposition device that performs deposition onto a surface of a substrate to be conveyed, the deposition device comprising an evaporation source facing the substrate, wherein the evaporation source comprises:

a flat plate shape target material formed of a deposition substance, a backing plate, wherein the target material is attached to a side of the backing plate, a magnet unit arranged on another side of the backing plate which is opposite to the side of the backing plate to which the target material is attached, the magnet unit comprising a center magnet and peripheral magnets forming a magnetic field for a magnetron discharge in the vicinity of a surface of the target material, a cathode body accommodating the magnet unit, wherein the magnet unit is formed in an oblong shape wherein the peripheral magnets comprise at least one short side peripheral magnet and at least one long side peripheral magnet, and wherein a height of the short side peripheral magnet is lower than a height of the long side peripheral magnet, and a cooling water flow passage in the cathode body for providing cooling water to the magnet unit.

5. A method of performing deposition onto a surface of a substrate by using the deposition device according to claim 1, wherein in a case where deposition is performed onto a surface of a narrow-width substrate having a narrower width than that of a substrate fit to the deposition device, a short magnetic unit is arranged, a short target material is arranged in correspondence with width of the arranged magnetic unit, and then deposition is implemented.

6. A method of performing deposition onto a surface of a substrate by using the deposition device according to claim 4, wherein in a case where deposition is performed onto a surface of a narrow-width substrate having a narrower width than that of a substrate fit to the deposition device, a short magnetic unit is arranged, a short target material is arranged in correspondence with width of the arranged magnetic unit, and then deposition is implemented.

* * * * *